US 6,680,529 B2

(12) United States Patent
Chen et al.

(10) Patent No.: US 6,680,529 B2
(45) Date of Patent: Jan. 20, 2004

(54) SEMICONDUCTOR BUILD-UP PACKAGE

(75) Inventors: Kun-Ching Chen, Tainan (TW); Yi-Chuan Ding, Kaohsiung (TW); In-De Ou, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 57 days.

(21) Appl. No.: 10/075,227

(22) Filed: Feb. 15, 2002

(65) Prior Publication Data

US 2003/0157747 A1 Aug. 21, 2003

(51) Int. Cl.⁷ .............................................. H01L 23/34
(52) U.S. Cl. ....................................... 257/700; 257/723
(58) Field of Search ................................ 257/700, 690, 257/723, 734, 737, 778, 779, 780, 784, 783

(56) References Cited

U.S. PATENT DOCUMENTS 5,565,706 A * 10/1996 Miura et al. ................. 257/723
6,271,469 B1   8/2001 Ma et al. .................... 174/52.4

* cited by examiner

Primary Examiner—Mark V. Prenty
(74) Attorney, Agent, or Firm—Troxell Law Office PLLC

(57) ABSTRACT

A semiconductor build-up package includes a die, a circuit board and at least a dielectric layer. The circuit board has a surface for building up the dielectric layer, and the surface has a cavity for accommodating the die. The inside of multi-layer circuit board has conductive traces for expanding the electrical function of semiconductor build-up package. Each dielectric layer has conductive columns so that the die may electrically connect with the outermost dielectric layer. At least a conductive column is bonded on the surface of the multi-layer circuit board for inner electrical connection.

19 Claims, 4 Drawing Sheets

SEMICONDUCTOR BUILD-UP PACKAGE

FIELD OF THE INVENTION

The present invention is relating to a semiconductor package, more particularly to a semiconductor build-up package with expanded electrical function.

BACKGROUND OF THE INVENTION

In the semiconductor packaging industry, chips are trending to small size, high density and have a large number of terminals (the number of I/O is more than one hundred). So that there are packaging techniques of CSP (chip scale package) and FC (flip chip) package provided to encapsulate chip(s) to become a semiconductor package. Due to the intervals between adjacent contacts of chip become very small, it is difficult to plant the solder balls and then the problems of surface mounting fail become more serious. So that reliability of electrical function and yield of semiconductor package would decrease largely, and the technology of CSP (chip scale package) or FC (flip chip) package is not suitable to be worked out.

In order to solve the problems mentioned above, a semiconductor package is brought up from U.S. Pat. No. 6,271,469 "direct build-up layer on an encapsulated die package". As shown in FIG. 1, the semiconductor build-up package 100 comprises a die 102, an encapsulating material 112, a first dielectric layer 118 and a second dielectric layer 126. The die 102 has an active surface 106 forming a plurality of contacts 108. The encapsulating material 112 covers the inactive surface 114 and sides 116 of the die 102 for protecting the die 102. The encapsulating material 112 has a surface that is coplanar to the active surface 106 of the die 102 for providing a substantially planar area for building up dielectric layers 118 and 126. The first dielectric layer 118, made of dielectric materials such as silicon oxide or silicon nitrogen, is formed on the area defined by the active surface 106 of the die 102 and the surface of the encapsulating material 112. The first dielectric layer 118 has a plurality of conductive traces 124 that are conductive metals such as copper, aluminum, or alloys thereof. The second dielectric layer 126 is formed above the first dielectric layer 118 and conductive traces 124, and has a plurality of conductive columns 132. The conductive pads 134 are formed on the second dielectric layer 126. A conductive path is constituted by one of conductive traces 124 and the corresponding conductive column 132 for electrically connecting the contacts 108 of the die 102 with the corresponding conductive pads 134. A solder mask 136 is formed on the second dielectric layer 126. Conductive pads 134 are exposed from the solder mask 136 for planting solder balls 138. Therefore, the contacts 108 of the die 102 can electrically fan out to the conductive pads 134 through the first dielectric layer 118 and the second dielectric layer 126 or more, so that it is easy for planting the solder balls 138 and surface mounting to PCB (print circuit board), etc. However in the conventional structure mentioned-above, the encapsulating material 112 is made of resin and becomes build-up forming surface of the first dielectric layer 118 and the second dielectric layer 126 without extra electrical function so that the semiconductor build-up package 100 is provided for packaging single chip.

SUMMARY

The main object of the present invention is to provide a semiconductor build-up package that comprises a die, a circuit board and at least a dielectric layer. The circuit board carries the die and has a surface for building up a plurality of dielectric layers in order to enhance the electrical function of the semiconductor build-up package.

The secondary object of the present invention is to provide a semiconductor build-up package on which the electrical connections between the circuit board and the die are through electrical paths of the dielectric layers. Resistances, condensers and fuses are embedded in wires inside the circuit board for expanding the electrical function of the die and shortening conductive paths of connecting traces.

According to the present invention, a semiconductor build-up package comprises a die, a circuit board and at least a dielectric layer. The die has an active surface with bonding pads and an inactive surface. The circuit board has a first surface and a second surface. A cavity or a through hole is formed on the first surface for accommodating the die and there are conductive traces inside the first surface for expanding the electrical function of the build-up package. It is preferable that the circuit board is a multi-layer printed circuit board and the first surface of the circuit board is coplanar to the active surface of the die for providing an enough planar area that is necessary to build up a plurality of dielectric layers. The dielectric layers are formed in turn on the area formed by the active surface of the die and the surface of the circuit board. A plurality of conductive pads are formed on the outermost dielectric layer. The dielectric layers have at least a conductive column electrically connecting the conductive traces of the circuit board. The conductive traces and conductive columns in each dielectric layer are made of copper, aluminum or alloys thereof for providing electrical connection. Further, a plurality of solder balls, bumps or pins are formed on the conductive pads for surface mounting the semiconductor build-up package to a printed circuit board, etc. Besides, further at least a second die is mounted on the second surface of the circuit board. The second die electrically connects with the conductive traces by wire bonding or flip chip mounting technique for electrically connecting with the corresponding conductive pads through the conductive columns of the dielectric layers, so that a semiconductor build-up package with multi-chip configuration is formed. By means of the conductive traces of circuit board and the conductive columns of dielectric layers, the plurality of dies electrically fan out to the outermost conductive pads. Furthermore, the contacts of the die may electrically be connected with the conductive traces of the circuit board through the conductive columns of dielectric layers. Resistances, condensers and fuses are embedded in wires inside the circuit board for expanding the electrical function of the build-up package and shortening the conductive paths of connecting traces.

DETAILED DESCRIPTION OF THE PRESENT INVENTION

Figure 1:
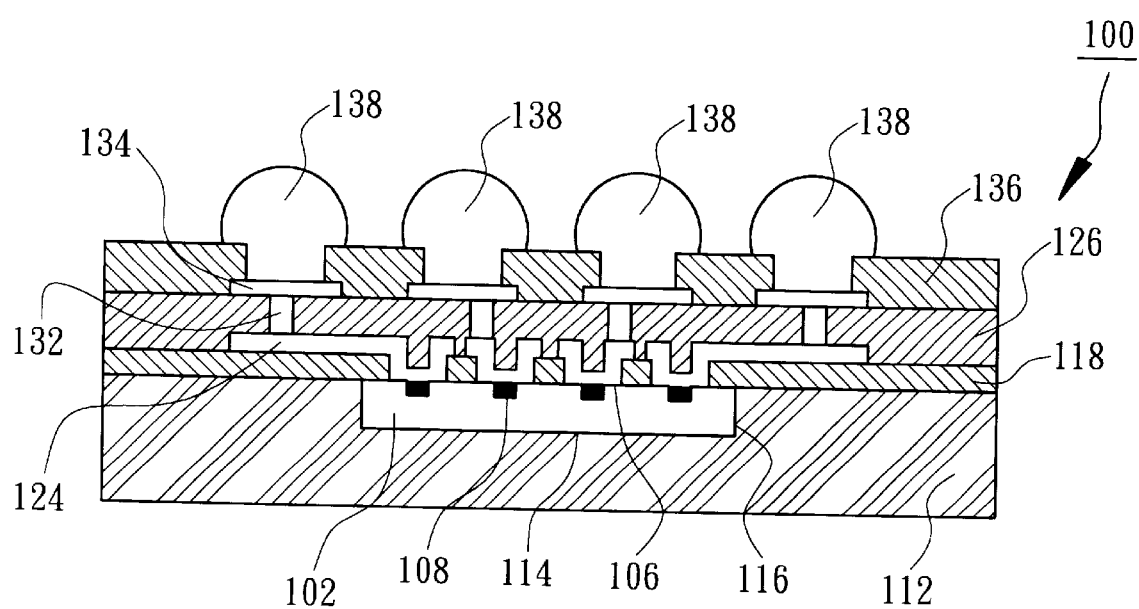
FIG. 1 is a cross-sectional view of a semiconductor build-up package disclosed in U.S. Pat. No. 6,271,469 "direct build-up layer on an encapsulated die package".

Referring to the drawings attached, the present invention will be described by means of the embodiments below.

Figure 2:
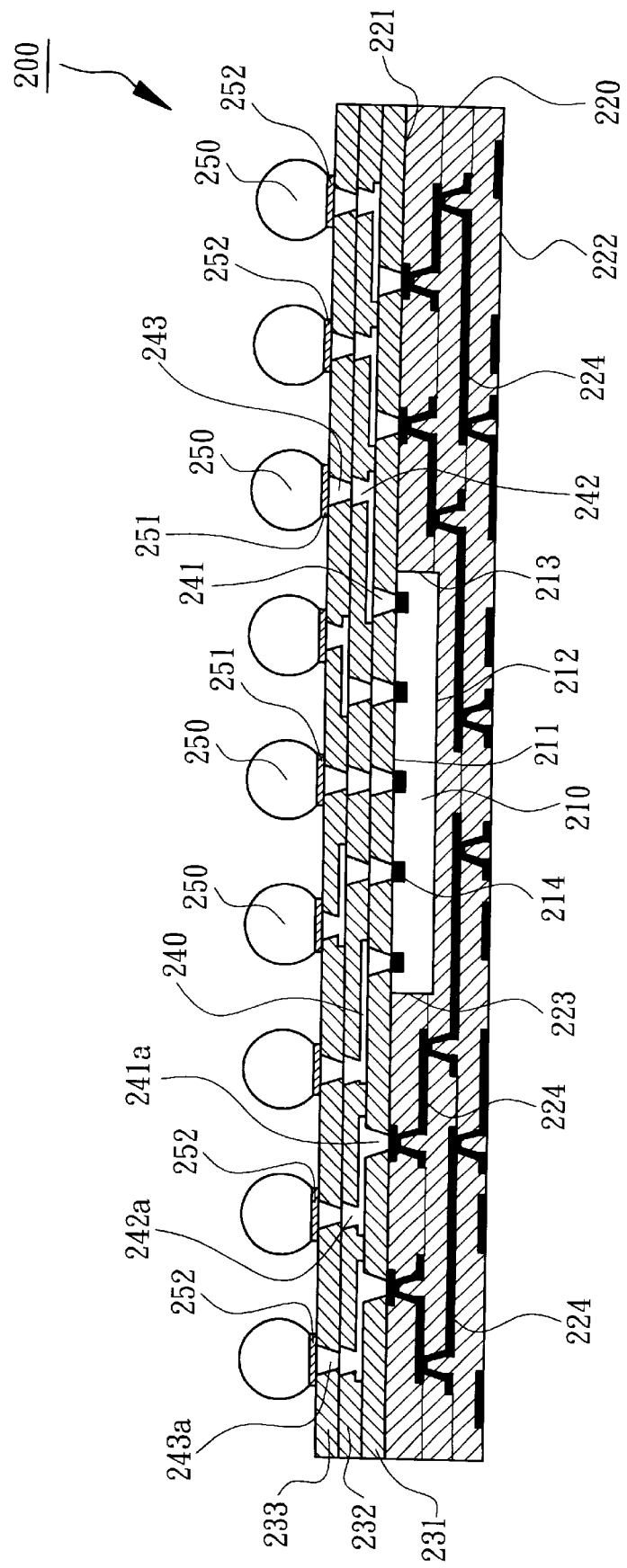
FIG. 2 is a cross-sectional view of a semiconductor build-up package in accordance with a first embodiment of the present invention.
Figure 3:
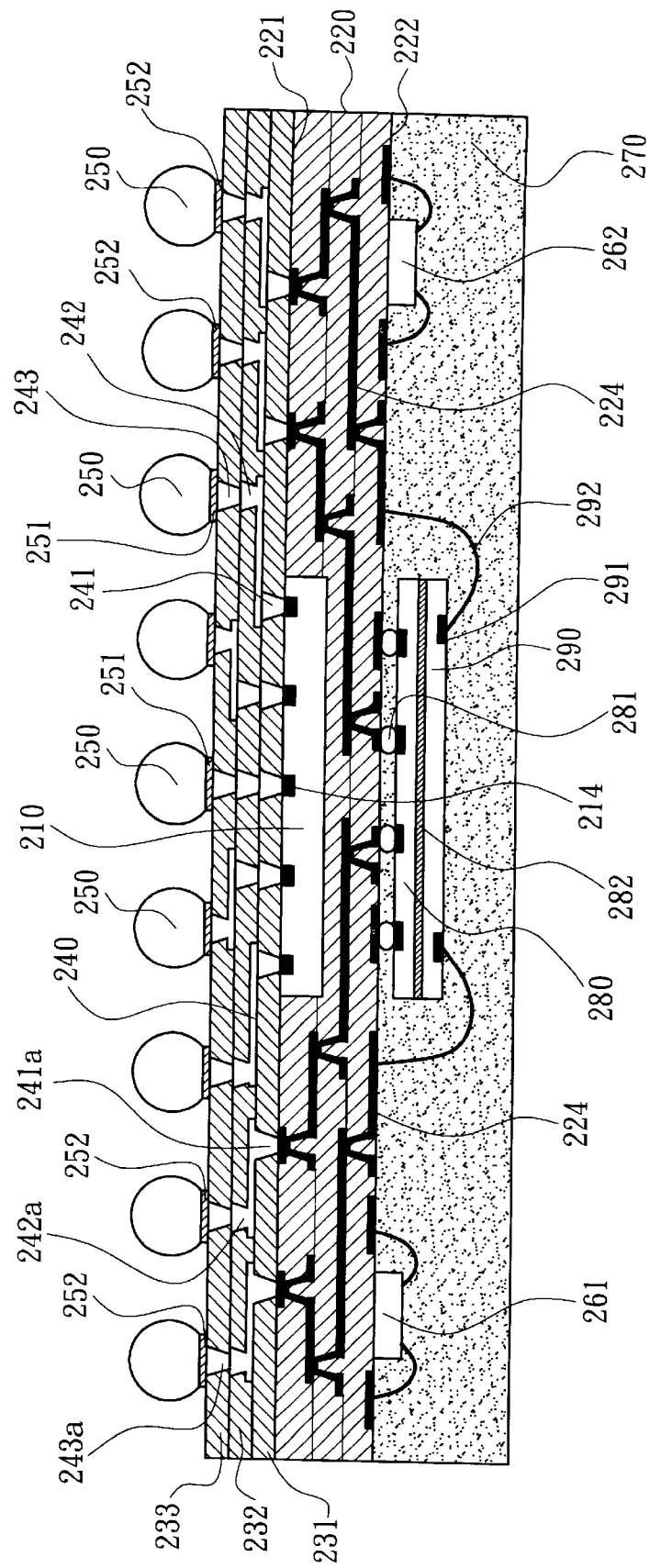
FIG. 3 is a cross-sectional view of a semiconductor build-up package with a plurality of chips in accordance with a first embodiment of the present invention.

In the first embodiment of the present invention, FIG. 2 is a cross-sectional view of a semiconductor build-up package. FIG. 3 is a cross-sectional view of a semiconductor build-up package with a plurality of chips. The semiconductor build-up package 200 comprises a first die 210, a multi-layer circuit board 220 and a plurality of dielectric layers 231, 232 and 233.

As shown in FIG. 2, the first die 210, made of silicon, gallium arsenide or other semiconductor materials, may be one kind of memory chip such as DRAM, SRAM, flash, DDR or Rambus, etc, or microcontroller, microprocessor, logic chip, ASIC or radio-frequency chip. It is better that the first die 210 is an advanced chip with large number of terminals (the number of I/O is more than one hundred) and high density. The first die 210 has an active surface 211 forming a plurality of contacts 214 and an inactive surface 212. The contacts 214 are electrically connected with the integrated circuits (not shown in drawings) of the first die 210. The multi-layer circuit board 220 generally is a multi-layer printed circuit board and supports the die 210 during the build-up packaging process. The multi-layer circuit board 220 has a first surface 221 and a second surface 222. A cavity 223 is formed on the first surface 221 for accommodating the first die 210 so that the inactive surface 212 and the sides 213 of the first die 210 are covered by the multi-layer circuit board 220. There is a plurality of conductive traces 224 inside the multi-layer circuit board 220 for expanding the electrical function of the semiconductor build-up package 200. The conductive traces 224 are made of copper, aluminum or alloys thereof to provide an extra electrical connection. It is preferable that the first surface 221 of the multi-layer circuit board 220 is coplanar to the active surface 211 of the first die 210 in order to provide a planar area for building up dielectric layers 231, 232 and 233.

The first dielectric layer 231, the second dielectric layer 232 and the third dielectric layer 233 are made of dielectric materials such as polyimide, epoxy, BT resin (bismaleimide triazine), BCB (benezo cyclobutene), PTFE (polytetrafluoroethylene), etc and are formed in turn on the active surface 211 of the first die 210 and the first surface 221 of the multi-layer circuit board 220. The first dielectric layer 231 is formed on the active surface 211 of the first die 210 and the first surface 221 of the multi-layer circuit board 220 and has a plurality of conductive columns 241 and 241a. The conductive columns 241 are electrically connected with the corresponding contacts 214 of the first die 210. The conductive columns 241a are bonded on the first surface 221 of the multi-layer circuit board 220 and electrically connect with the corresponding conductive traces 224 of the multi-layer circuit board 220. The second dielectric layer 232 is formed on the first dielectric layer 231 and also has a plurality of conductive columns 242 and 242a. The conductive columns 242 are electrically connected with the conductive columns 241 of the first dielectric layer 231. The conductive columns 242a are electrically connected with the conductive columns 241a of the first dielectric layer 231. Some of the conductive columns 242 of the second dielectric layer 232 are vertically corresponding to the conductive columns 241 of the first dielectric layer 231. Furthermore, the third dielectric layer 233 is formed on the second dielectric layer 232 and has a plurality of conductive columns 243 and 243a. A plurality of first conductive pads 251 and second conductive pads 252 are formed on the third dielectric layer 233. It is better that the first conductive pads 251 and the second conductive pads 252 are in grid array fashion. The conductive columns 243 are electrically connected with the conductive columns 242 of the second dielectric layer 232 and the first conductive pads 251. The conductive columns 243a are electrically connected with the conductive columns 242a of the second dielectric layer 232 and the second conductive pads 252. Some of the conductive columns 243 and 243a of the third dielectric layer 233 are vertically corresponding to the conductive columns 242 and 242a of the second dielectric layer 232. Furthermore, there are circuit layers 240 among the first dielectric layer 231, the second dielectric layer 232 and the third dielectric later 233 for electrically connecting conductive columns 241, 241a, 242, 242a, 243 and 243a mutually. Therefore, the contacts 214 of the first die 210 electrically connect with the corresponding first conductive pads 251 on the third dielectric layer 233 through the conductive columns 241, 242 and 243. Furthermore, the conductive traces 224 of the multi-layer circuit board 220 electrically connect with the corresponding second conductive pads 252 through the conductive columns 241a, 242a and 243a. The conductive columns 241, 241a, 242, 242a, 243 and 243a are made of copper, aluminum or alloys thereof. Some of conductive columns 241, 241a, 242, 242a, 243 and 243a of the dielectric layers 231, 232 and 233 have column-on-column configuration and vertically correspond to the conductive columns in the adjacent dielectric layers for providing an excellent electrical connection. Besides, solder balls 250, bumps or pins are formed on the first conductive pads 251 and the second conductive pads 252 for surface mounting the semiconductor package 200 to a printed circuit board, etc.

The multi-layer circuit board 220 is a chip carrier for building up process in the semiconductor build-up package 200 mentioned above. The conductive traces 224 inside the multi-layer circuit board 220 expand the electrical function so that the semiconductor package 200 can be in multi-chip configuration. As shown in FIG. 3, a plurality of dies 280, 290, 261 and 262 are mounted on the second surface 222 of the multi-layer circuit board 220. The active surface of the second die 280 has a plurality of bumps 281. The bumps 281 are bonded on the second surface 222 of the multi-layer circuit board 220 as flip chip type and then electrically connect with the corresponding second conductive pads 252 through the conductive traces 224 of the multi-layer circuit board 220 and the conductive columns 241a, 242a and 243a of the multi-dielectric layers 231, 232 and 233. The inactive surface of the third die 290 is adhered by epoxy adhesive or tape and then stacked on the inactive surface of the second die 280. The active surface of the third die 290 has a plurality of contacts 291. By means of wire bonding method, the contacts 291 are electrically bonded with conductive traces 224 of second surface 222 of the multi-layer circuit board 220 by metal wires 292 and electrically connect with the corresponding second conductive pads 252 through the conductive traces 224 and the conductive columns 241a, 242a and 243a of the dielectric layers 231, 232 and 233. Thus the second die 280 and the third die 290 have outer terminals (i.e. solder balls 250) of electrical connection for surface mounting. Furthermore, The second surface 222 of the multi-layer circuit board 220 is electrically connected with the fourth die 261 and the fifth die 262 or more dies (the fourth die 261 and the fifth die 262 are electrically coupled to the multi-layer circuit board 220), then the dies 280, 290, 261 and 262 are sealed by an encapsulating material 270. The multi-layer circuit board 220 electrically connects the bumps 281 of the second die 280 and the contacts 291 of the third die 290 with the conductive columns 241a, 242a and 243a of the multi-dielectric layers 231, 232 and 233 and circuit layers 240, and also electrically couples to the second conductive pads 252. Therefore, the semiconductor build-up package 200 may be provided for multi-chip package to expand the electrical function, such as applications of memory modules or system in package. Also the semiconductor build-up package 200 integrates a plurality of dies into a package by build-up technique for greatly increasing the yield and reliability of electrical connection.

Figure 4:
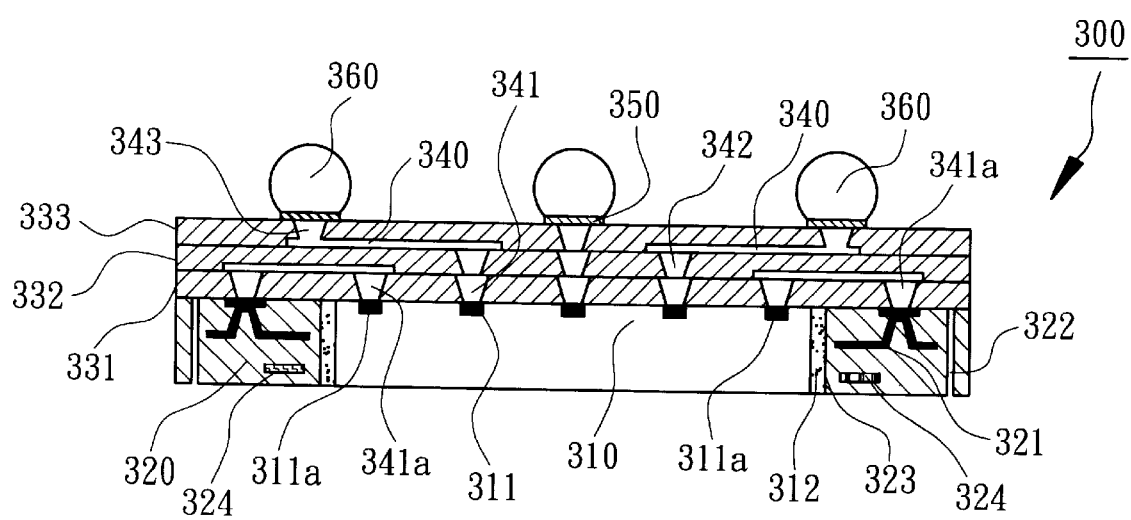
FIG. 4 is a cross-sectional view of a semiconductor build-up package in accordance with a second embodiment of the present invention.

In the second embodiment of the present invention, FIG. 4 is a cross-sectional view of a semiconductor build-up package. The semiconductor build-up package 300 comprises a die 310, a multi-layer printed circuit board 320 and a plurality of dielectric layers 331, 332 and 333.

As shown in FIG. 4, the active surface of the die 310 forms a plurality of contacts 311. The contacts 311 are electrically connected with the integrated circuit (not shown in the drawings) inside the die 310. The multi-layer printed circuit board 320 has a first surface for building up dielectric layers 331, 332 and 333 and a through hole 323 for adhering the die 310 by adhesive 312. The through hole 323 goes through first surface and second surface of the multi-layer printed circuit board 320. There are conductive traces 321 or conductive holes 322 inside the multi-layer printed circuit board 320 for expanding the electrical function of the semiconductor build-up package 300. Furthermore, the first dielectric layer 331, the second dielectric layer 332 and the third dielectric layer 333 are in turn formed on the active surface of the die 310 and the first surface of the multi-layer printed circuit board 320. It is better that first surface of the multi-layer printed circuit board 320 is coplanar to the active surface of the die 310. The outer surface of the third dielectric layer 333 (the outermost dielectric layer) forms a plurality of conductive pads 350. Solder balls 360 are formed on the conductive pads 350 for surface mounting. Each layer of dielectric layers 331, 332 and 333 has conductive columns 341, 341a, 342 and 343 that electrically connect circuit layers 340. The conductive columns 341, 342 and 343 electrically connect the contacts 311 of the die 310 with the conductive pads 350. Besides, as shown in FIG. 4, the conductive columns 341a of the first dielectric layer 331 are bonded on the first surface of the multi-layer printed circuit board 320 for electrically connecting some contacts 311a of the die 310 with the conductive traces 321 of the multi-layer printed circuit board 320. Condensers, resistances and fuses are embedded in wires inside the multi-layer printed circuit board 320 by electroplating or printing method for expanding the electrical function of the semiconductor build-up package 300 and shortening conductive paths of connecting traces.

The above description of embodiments of this invention is intended to be illustrated and not limiting. Other embodiments of this invention will be obvious to those skilled in the art in view of the above disclosure.

What is claimed is:

1. A semiconductor build-up package comprising:

a die having an active surface with a plurality of contacts and an inactive surface;

a circuit board having a first surface, a second surface and a plurality of conductive traces, the circuit board being a multi-layer printed circuit board, wherein the first surface has a cavity for accommodating the die; and a first dielectric layer formed on the active surface of the die and the first surface of the circuit board, having a plurality of conductive columns, wherein at least a conductive column is electrically coupled to the conductive traces of the circuit board.

2. The semiconductor build-up package in accordance with the claim 1, further comprising at least a second dielectric layer formed on the first dielectric layer, the second dielectric layer having a plurality of conductive columns.

3. The semiconductor build-up package in accordance with the claim 2, wherein at least a conductive column of the second dielectric layer is vertically bonded on the corresponding conductive column of the first dielectric layer.

4. The semiconductor build-up package in accordance with the claim 1, wherein the first surface of the circuit board is coplanar to the active surface of the die.

5. The semiconductor build-up package in accordance with the claim 1, wherein the circuit board includes resistances, condensers or fuses inside.

6. The semiconductor build-up package in accordance with the claim 1, wherein the die is adhered at the cavity.

7. The semiconductor build-up package in accordance with the claim 2, further comprising solder balls, bumps or pins formed on the second dielectric layer.

8. The semiconductor build-up package in accordance with the claim 1, wherein the conductive column of the first dielectric layer is vertically bonded on the first surface of the circuit board.

9. The semiconductor build-up package in accordance with the claim 1, further comprising a second die on the second surface of the circuit board.

10. The semiconductor build-up package in accordance with the claim 9, further comprising a plurality of bonding wires electrically connecting the second die with the circuit board.

11. The semiconductor build-up package in accordance with the claim 9, further comprising flip chip bumps electrically connecting the second die with the circuit board.

12. A semiconductor multi-chip package comprising:

at least a first die having an active surface, and inactive surface and a plurality of contacts on the active surface;

a circuit board having a first surface, a second surface, a cavity formed on the first surface for accommodating the first die, wherein there are a plurality of conductive traces inside the circuit board;

a first dielectric layer formed on the active surface of the first die and the first surface of the circuit board, the first dielectric layer having a plurality of conductive columns, wherein at least a conductive column electrically connects with the conductive traces of the circuit board; and at least a second die mounted on the second surface of the circuit board, the second die having a plurality of contacts which are electrically coupled to the conductive traces of the circuit board.

13. The semiconductor multi-chip package in accordance with the claim 13, further comprising at least a second dielectric layer lying on the first dielectric layer, the second dielectric layer having a plurality of conductive columns.

14. The semiconductor multi-chip package in accordance with the claim 13, wherein at least a conductive column of the second dielectric layer is vertically bonded on the corresponding conductive column of the first dielectric layer.

15. The semiconductor multi-chip package in accordance with the claim 13, further comprising a circuit layer between the first dielectric layer and the second dielectric layer for electrically connecting with the conductive columns.

16. The semiconductor multi-chip package in accordance with the claim 13, further comprising solder balls, bumps or pins formed on the second dielectric layer.

17. The semiconductor multi-chip package in accordance with the claim 12, wherein the first surface of the circuit board is coplanar to the active surface of the first die.

18. The semiconductor multi-chip package in accordance with the claim 12, wherein the circuit board is a multi-layer printed circuit board.

19. The semiconductor multi-chip package in accordance with the claim 12, further comprising an encapsulating material on the second surface of the circuit board.

* * * * *